(12) United States Patent
Hill

(10) Patent No.: US 6,856,402 B2
(45) Date of Patent: Feb. 15, 2005

(54) INTERFEROMETER WITH DYNAMIC BEAM STEERING ELEMENT

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 206 days.

(21) Appl. No.: 10/364,666

(22) Filed: Feb. 11, 2003

(65) Prior Publication Data

US 2003/0184759 A1 Oct. 2, 2003

Related U.S. Application Data

(60) Provisional application No. 60/356,393, filed on Feb. 12, 2002.

(51) Int. Cl.[7] .................................................. G01B 9/02
(52) U.S. Cl. ....................... 356/487; 356/493; 356/498; 356/510
(58) Field of Search ................................ 356/487, 493, 356/498, 500, 510

(56) References Cited

U.S. PATENT DOCUMENTS

| | | | |
|---|---|---|---|
| 4,662,750 A | | 5/1987 | Barger |
| 4,711,573 A | | 12/1987 | Wijntjes et al. |
| 4,714,339 A | | 12/1987 | Lau et al. |
| 4,790,651 A | | 12/1988 | Brown et al. |
| 4,802,765 A | | 2/1989 | Young et al. |
| 5,408,318 A | | 4/1995 | Slater |
| 5,491,550 A | | 2/1996 | Dabbs |
| 5,757,160 A | | 5/1998 | Kreuzer |
| 5,781,277 A | | 7/1998 | Iwamoto |
| 5,951,482 A | | 9/1999 | Winston et al. |
| 6,040,096 A | | 3/2000 | Kakizaki et al. |
| 6,252,667 B1 | * | 6/2001 | Hill et al. .................... 356/487 |
| 6,271,923 B1 | * | 8/2001 | Hill ............................. 356/487 |
| 6,313,918 B1 | * | 11/2001 | Hill et al. .................... 356/498 |
| 6,330,105 B1 | | 12/2001 | Rozelle et al. |
| 6,359,692 B1 | | 3/2002 | Groot |
| 6,541,759 B1 | * | 4/2003 | Hill ........................ 250/227.27 |
| 6,631,004 B1 | * | 10/2003 | Hill et al. .................... 356/487 |

FOREIGN PATENT DOCUMENTS

| | | |
|---|---|---|
| WO | WO 00/17605 | 3/2000 |
| WO | WO 00/66969 | 11/2000 |

OTHER PUBLICATIONS

Bennett, S.J., "A Double–passed Michelson Interferometer," *Optics Communications*, 4:428–430, Feb./Mar. 1972.

* cited by examiner

Primary Examiner—Gregory J. Toatley, Jr.
Assistant Examiner—Patrick Connolly
(74) Attorney, Agent, or Firm—Fish & Richardson P.C.

(57) ABSTRACT

An interferometry system includes: i) a first polarizing beam splitter which during operation separates an input beam into a measurement beam and a reference beam; ii) a beam steering element positioned to direct the measurement beam, and not the reference beam, the measurement beam contacting the beam steering element; iii) an interferometer positioned to receive at least a portion of the measurement beam and direct it to a measurement object, which reflects it to define a return measurement beam, and wherein the interferometer is further positioned to receive at least a portion of the reference beam and direct it to a reference object, which reflects it to define a return reference beam; and (iv) an electronic control circuit coupled to the beam steering element. During operation the control circuit adjusts the orientation of the beam steering element in response to changes in the angular orientation of the measurement object. The beam steering element is further positioned to direct the return reference beam, and not the return measurement beam, the return reference beam contacting the beam steering element. The first polarizing beam splitter recombines the return reference beam and the return measurement beam to form an output beam.

33 Claims, 7 Drawing Sheets

INTERFEROMETER WITH DYNAMIC BEAM STEERING ELEMENT

CROSS-REFERENCE TO RELATED APPLICATIONS

This application claims priority under 35 U.S.C. §119(e) to U.S. Provisional Application Ser. No. 60/356,393 entitled "INTERFEROMETER WITH DYNAMIC BEAM STERRING ELEMENT REDIRECTING INPUT MEASUREMENT BEAM COMPONENT AND OUTPUT REFERENCE BEAM COMPONENT," by Henry A. Hill and filed Feb. 12, 2002. The contents of said provisional application is incorporated herein by reference.

BACKGROUND

This invention relates to interferometers, e.g., displacement measuring and dispersion interferometers that measure angular and linear displacements of a measurement object such as a mask stage or wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change substantially equal to a distance change L of $\lambda/(np)$, where L is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors can also be present.

There are also "non-cyclic non-linearities" such as those caused by a change in lateral displacement (i.e., "beam shear") between the reference and measurement beam components of an output beam of an interferometer when the wavefronts of the reference and measurement beam components have wavefront errors. This can be explained as follows.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

The interferometers described above are often crucial components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In many lithography systems and other applications, the measurement object includes one or more plane mirrors to reflect the measurement beam from each interferometer. Small changes in the angular orientation of the measurement object, e.g., pitch and yaw of a stage, can alter the direction of each measurement beam reflected from the plane mirrors. If left uncompensated, the altered measurement beams reduce the overlap of the exit measurement and reference beams in each corresponding interferometer. Furthermore, these exit measurement and reference beams will not be propagating parallel to one another nor will their wave fronts be aligned when forming the mixed beam. As a result, the interference between the exit measurement and reference beams will vary across the transverse profile of the mixed beam, thereby corrupting the interference information encoded in the optical intensity measured by the detector.

To address this problem, many conventional interferometers include a retroreflector that redirects the measurement beam back to the plane mirror so that the measurement beam "double passes" the path between the interferometer and the measurement object. The presence of the retroreflector insures that the direction of the exit measurement is insensitive to changes in the angular orientation of the measurement object. When implemented in a plane mirror interferometer, the configuration results in what is commonly referred to as a high-stability plane mirror interferometer (HSPMI). However, even with the retroreflector, the lateral position of the exit measurement beam remains sensitive to changes in the angular orientation of the measurement object. Furthermore, the path of the measurement beam through optics within the interferometer also remains sensitive to changes in the angular orientation of the measurement object.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbe offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

To measure each degree of freedom, an interferometer is used to monitor distance changes along a corresponding metrology axis. For example, in systems that measure the x and y positions of the stage as well as the angular orientation of the stage with respect to the x, y, and z axes, at least three spatially separated measurement beams reflect from one side of the wafer stage and at least two spatially separated measurement beams reflect from another side of the wafer stage. See, e.g., U.S. Pat. No. 5,801,832 entitled "Method of and Device for Repetitively Imaging a Mask Pattern on a Substrate Using Five Measuring Axes," the contents of which are incorporated herein by reference. Each measurement beam is recombined with a reference beam to monitor optical path length changes along the corresponding metrology axes. Because the different measurement beams contact the wafer stage at different locations, the angular orientation of the wafer stage can then be derived from appropriate combinations of the optical path length measurements. Accordingly, for each degree of freedom to be monitored, the system includes at least one measurement beam that contacts the wafer stage. Furthermore, as described above, each measurement beam may double-pass the wafer stage to prevent changes in the angular orientation of the wafer stage from corrupting the interferometric signal. The measurement beams may generated from physically separate interferometers or from multi-axes interferometers that generate multiple measurement beams.

SUMMARY

In a preferred embodiment, the invention features an interferometry system having a dynamic beam steering element that directs the measurement beam component of an input beam, but not the reference beam component of the input beam, and directs the return reference beam component of an output beam, but not the return measurement beam of the output beam. An electronic control circuit dynamically adjusts the orientation of the beam steering element in response to changes in the orientation of the measurement object (e.g., the stage mirror of a lithography stage). In conjunction with the electronic control circuit, the beam steering element "conditions" the measurement beam component of the input beam to have a propagation direction that causes the measurement beam to contact the measurement object at normal incidence in a downstream interferometer. The beam steering element also redirects the return reference beam component of the output beam (but not the return measurement beam component) so that the reference and measurement beam components of the output beam can be made to propagate parallel to one another at the detector (or a fiber-optic pick-up (FOP) to a detector).

Notably, because the reference beam does not contact the beam steering element until it is part of the output beam, the reference beam under goes no shear in the interferometer as a function of the orientation of the stage mirror, and only a small amount of shear at the detector based on the (typically small) path length between the beam steering element and the detector (or a FOP) on the return pass. Furthermore, the relative shear between the return measurement beam component and the return reference beam component can be made zero at the detector (or a FOP), even over a range of angular orientations of the stage mirror. For example, by making the path length for the measurement beam component to the interferometer equal to the path length for the return measurement beam component from the interferometer, the return measurement beam component sees little or no shear as a function of the orientation of the stage mirror because the measurement beam is made to contact the stage mirror at normal incidence. The reduction of relative shear between the measurement and reference beam components at the detector or FOP substantially reduces errors in the interferometric measurement. Furthermore, the reduction of shear in the reference beam path within the interferometer substantially reduces non-cyclic errors.

In addition, the system may employ a single-pass interferometer, and thereby enjoy the advantages of a single-pass design (e.g., small footprint on the stage, faster slew rates, etc.). Furthermore, the system can be designed to maintain the relative transverse orientations of the reference and measurement beam components at the detector (or FOP), in other words, there is no image inversion between the beam components. Moreover, the system can be extended in a straightforward manner to provide multiple measurement axes by, e.g., separating the conditioned input beam measurement component into multiple measurement beams.

In general, in one aspect, the invention features an interferometry system including: i) a first polarizing beam splitter positioned to separate an input beam into a first beam and a second beam; ii) a beam steering element positioned to direct the first beam, and not the second beam, the first beam contacting the beam steering element; iii) an interferometer positioned to receive one of the first and second beams and direct it to a measurement object, which reflects it to define a measurement return beam, and wherein the interferometer is further positioned to receive the other of the first and second beams and direct it to a reference object, which reflects it to define a reference return beam; and iv) an electronic control circuit coupled to the beam steering element, wherein during operation the control circuit adjusts the orientation of the beam steering element in response to changes in the angular orientation of the measurement object. The beam steering element is further positioned to direct the return beam derived from the second beam, and not the return beam derived from the first beam, the return beam derived from the second beam contacting the beam steering element. The first polarizing beam splitter is positioned to recombine the return beams to form an output beam.

Embodiments of the interferometry system may include any of the following features.

The system may further include a source for producing the input beam, wherein the input beam includes a heterodyne frequency splitting between orthogonal polarization components corresponding the first and second beams.

The system may further include a detector system for measuring interferometric information in the output beam. For example, the detector system may include a fiber optic pick-up (FOP) and a photodetector, wherein the FOP is positioned to couple the output beam to the photodetector.

The interferometer may direct the first beam to contact the measurement object, the first beam defining a measurement beam, and the interferometer may direct the second beam to contact the reference object, the second beam defining a reference beam.

The system may further include a second polarizing beam splitter positioned to recombine the measurement and reference beams after the measurement beam contacts the beam steering element and before the interferometer redirects the measurement and reference beams, and separate return measurement and reference beams after the interferometer and before the return reference beam contacts the beam steering element.

For example, the measurement and reference beams may travel along a first path from the second polarizing beam splitter to the interferometer, the return measurement and reference beams may travel along a second path from the interferometer to the second polarizing beam splitter, and the first and second paths may differ.

Moreover, the measurement beam and the return reference beam may contact the same side of the beam steering element. Also, the second path may includes an optical system that provides a fold. For example, the fold can be selected to cause the measurement and reference beam components of the output beam to propagate parallel to one another over a range of angular orientations of the measurement object.

The optical path length of the first path may equal that of the second path.

The optical path length of the first path relative to that of the second path may selected to minimize the differential shear between the reference and measurement beam components of the output beam.

The measurement object may include a plane mirror.

The interferometer may be a single-pass interferometer that directs the measurement beam to contact the measurement object only once.

The interferometer may include a polarizing beam-splitter positioned to direct the measurement beam to the measurement object and the reference beam to the reference object. The interferometer may further include a reference quarter wave retarder positioned between the polarizing beam splitter in the interferometer and the reference object, and a measurement quarter wave retarder positioned between the polarizing beam splitter in the interferometer and the measurement object.

During operation, the control circuit may cause the beam steering element to direct the measurement beam to contact the measurement object at normal incidence over a range of angular orientations of the measurement object.

During operation the control circuit may adjust the orientation of the beam steering element based on an error signal corresponding to a difference in propagation direction between components in the output beam corresponding to the measurement and reference return beams. For example, the control circuit may adjust the orientation of the beam steering element to minimize the error signal. The electronic control circuit may include a differential angle displacement interferometer configured to generate the error signal.

In general, in another aspect, the invention features an interferometry method including: i) separating an input beam into a first beam and a second beam, wherein the first and second beams are orthogonally polarized; ii) using a beam steering element to direct the first beam, and not the second beam, the first beam contacting the beam steering element; iii) directing one of the first and second beams to a measurement object, which reflects it to define a measurement return beam; iv) directing the other of the first and second beams to a reference object, which reflects it to define a reference return beam; v) using the beam steering element to direct the return beam derived from the second beam, and not the return beam derived from the first beam, the return beam derived from the second beam contacting the beam steering element; vi) combining the return beams to form an output beam; and vii) using an electronic control circuit to adjust the orientation of the beam steering element in response to changes in the angular orientation of the measurement object.

Embodiments of the interferometry method may include any method feature corresponding to any of the features described above for the interferometry system.

In another aspect, the invention features a lithography system for use in fabricating integrated circuits on a wafer. The lithography system includes: a stage for supporting the wafer; an illumination system for imaging spatially patterned radiation onto the wafer; a positioning system for adjusting the position of the stage relative to the imaged radiation; and any of the interferometric apparatus described above for monitoring the position of the wafer relative to the imaged radiation.

In another aspect, the invention features another lithography system for use in fabricating integrated circuits on a wafer. This lithography system includes: a stage for supporting the wafer; and an illumination system including a radiation source, a mask, a positioning system, a lens assembly, and any of the interferometric apparatus described above. During operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

In another aspect, the invention features a beam writing system for use in fabricating a lithography mask. The beam writing system includes: a source providing a write beam to pattern a substrate; a stage supporting the substrate; a beam directing assembly for delivering the write beam to the substrate; a positioning system for positioning the stage and beam directing assembly relative one another; and any of the interferometric apparatus described above for monitoring the position of the stage relative to the beam directing assembly.

In another aspect, the invention features a lithography method for use in fabricating integrated circuits on a wafer. The lithography method includes: supporting the wafer on a moveable stage; imaging spatially patterned radiation onto the wafer;adjusting the position of the stage; and monitoring the position of the stage using any of the interferometric methods described above.

In another aspect, the invention features another lithography method for use in the fabrication of integrated circuits. This lithography method includes: directing input radiation through a mask to produce spatially patterned radiation; positioning the mask relative to the input radiation; monitoring the position of the mask relative to the input radiation using any of the interferometry methods described above; and imaging the spatially patterned radiation onto a wafer.

In another aspect, the invention features a third lithography method for fabricating integrated circuits on a wafer including: positioning a first component of a lithography system relative to a second component of a lithography system to expose the wafer to spatially patterned radiation; and monitoring the position of the first component relative to the second component using any of the interferometric methods described above.

In another aspect, the invention features a method for fabricating integrated circuits, the method including any of the lithography methods described above.

In another aspect, the invention features a method for fabricating integrated circuits, the method including using any of the lithography systems described above.

In another aspect, the invention features a method for fabricating a lithography mask, the method including: directing a write beam to a substrate to pattern the substrate; positioning the substrate relative to the write beam; and monitoring the position of the substrate relative to the write beam using any of the interferometry methods described above.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION OF PREFERRED EMBODIMENTS

Figure 1:
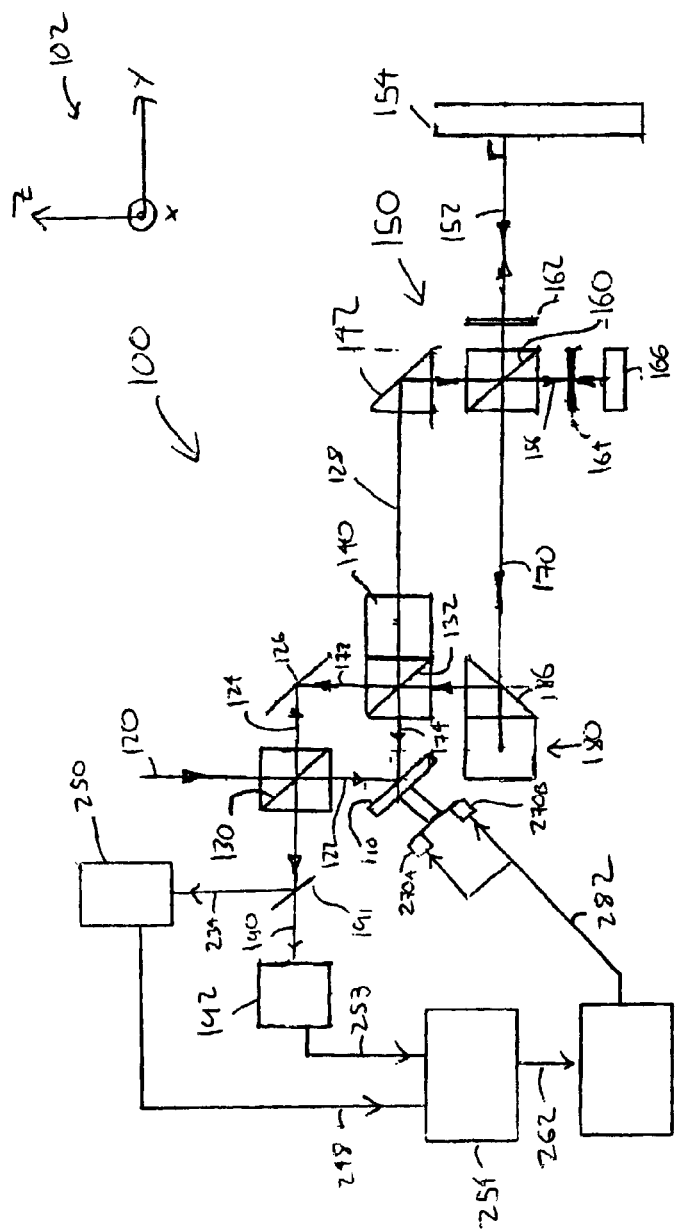
FIG. 1 is a schematic diagram of an interferometric system in a plan view looking down along the x-axis.

An interferometry system 100 including a dynamic beam steering element 110 (e.g., a mirror having an electronically controlled orientation) for conditioning the measurement beam component 122 of an input beam 120 is shown in FIG. 1. FIG. 1 is a plan view of interferometry system 100 looking down along the x-axis as indicated by Cartesian coordinate axes 102. As will be described further below, an electronic control circuit adjusts the orientation of beam steering element 110 in response to changes in the orientation of a plane mirror measurement object 154 (e.g., a stage mirror for a lithography system) for a downstream interferometer 150. The electronic control circuit causes beam steering element 110 to redirect measurement beam component 122 to cause a measurement beam 152 in interferometer 150 (wherein measurement beam 152 is derived from input beam measurement component 122) to contact plane mirror 154 at normal incidence over a range of angular orientations of plane mirror 154.

Referring again to FIG. 1, input beam 120 includes orthogonally polarized components having a frequency splitting suitable for heterodyne interferometry. A first polarizing beam splitter (PBS) 130 separates input beam 120 into input measurement beam component 122 and an input reference beam component 124. Beam steering element 110 then redirects measurement beam component 122 towards a second polarizing beam splitter 132, which recombines the measurement beam component 122 with reference beam component 124 to form intermediate input beam 128 after reference beam component is directed to the second PBS by mirror 126. As described above, beam steering element 110, under the control of the electronic control circuit, "conditions" the measurement beam component of intermediate input beam 128 to have a propagation direction that causes measurement beam 152 to contact plane mirror 154 at normal incidence for a range of angular orientations of the plane mirror.

Figure 2B:
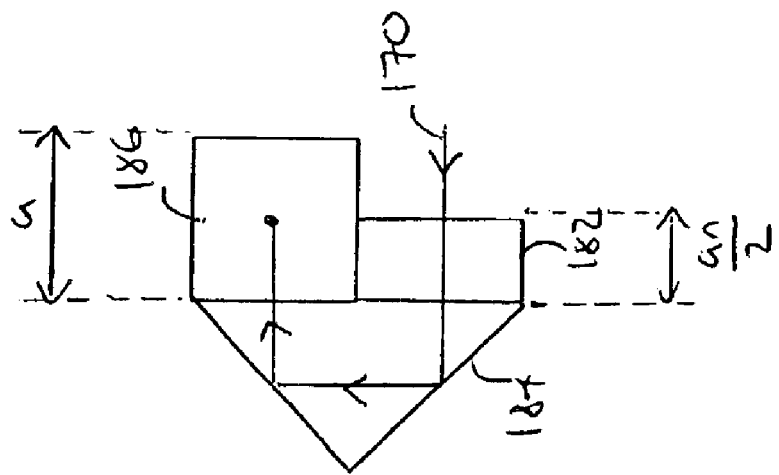
FIGS. 2a–2b are schematic diagrams of optical assembly components used in the system of FIG. 1, the diagrams show a side view in the x-y plane.
Figure 2A:
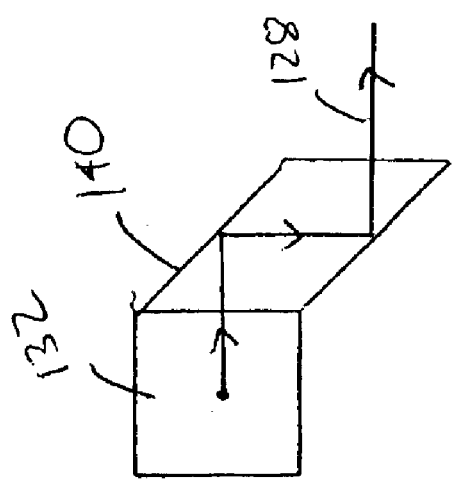

Following PBS 132, intermediate input beam 128 contacts rhomb 140, which lowers the beam 128 into another y-z plane. A side view of rhomb 140 in the x-y plane is shown in FIG. 2a. A right-angle prism 142 then directs beam 128 to single-pass plane mirror interferometer 150. Interferometer includes a third PBS 160, quarter wave plates 162 and 164, and plane reference mirror 166.

PBS 160 separates beam 128 into measurement beam 152 (derived from the input measurement beam component 122) and a reference beam 156 (derived from input reference beam component 124), directs measurement beam 152 to contact plane measurement mirror 156, and directs reference beam 156 to contact plane reference mirror 166. Following respective reflections from mirrors 154 and 166, PBS 160 recombines the reference and measurement beams to form return beam 170. Because the reference and measurement beams double pass quarter wave plates 164 and 162, respectively, return beam 170 propagates along a path different from intermediate input beam 128.

Return beam 170 then encounters optical assembly 180, which introduces a fold in the return path, elevates the beam to the original y-z plane, and directs the beam back to second PBS 132. A side view of optical assembly 180 in the x-y plane is shown in FIG. 2b. Optical assembly 180 includes optical flat 182, Porro prism 184, and right-angle prism 186.

PBS 132 separates return beam 170 into its polarization components, thereby directing return reference beam 174 (derived from reference beam 156) to beam steering element 110 and a return measurement beam 172 (derived from measurement beam 152) to mirror 126. Accordingly, between PBS 132 and PBS 130, the return measurement beam component travels along a return path corresponding to the input reference beam component, and the return reference beam component travels along a path corresponding to the input measurement beam component. Following respective reflections from beam steering element 110 and mirror 126, PBS 110 recombines the return reference and measurement beam components to form output beam 190.

A detector system 192 then measures an interferometric signal derived from the interference between the return reference and measurement beam components in output beam 190. To do this, the detector system typically includes a polarizer position to mix the orthogonal polarizations of the return reference and measurement beam components in output beam 190. Detector system 192 may further include a fiber optic pickup (FOP) (not shown) for coupling the output beam to a distance photodetector. Although changes in the orientation of measurement mirror 154 may cause the return measurement and reference components of return beam 170 to propagate at angle to one another, the return measurement and reference components of output beam 190 are made parallel to one another after return reference beam 174 contacts beam steering element 110.

Interferometer 150 introduces phase shift $\phi_1$ between the measurement and reference beam components of output beam 190. The magnitude of phase shift $\phi_1$ is related to difference in round-trip physical length $2L_1$ of the measurement path and reference paths according to the formula $$\phi_1 = 2k_1 L_1 n_1 \qquad (1)$$

where $n_1$ is the average of the refractive index of a gas in the measurement path. Detector system 192 generates electrical interference signal or heterodyne signal 248 containing the heterodyne phase $\phi_1$. Heterodyne signal 248 is transmitted to analyzer 254. Analyzer 254 includes a phase meter that obtains heterodyne phase $\phi_1$ using a phase meter and a reference phase from the source of input beam 120. Analyzer 254 further includes a processor that computes the change in displacement of mirror 154 using Equation (1).

Referring still to FIG. 1, it is notable that the reference beam component (i.e., reference beam component of intermediate input beam 128, reference beam 154, and return reference beam component 174) does not experience any shear as a function of the orientation of stage mirror 154 until just before PBS 130 recombines the return reference and measurement beams to form the output beam when it contacts beam steering element 110 on the return pass. Thus, there are no errors associated with the reference beam component traveling through different regions of glass in, e.g., PBS 132, rhomb 140, interferometer 150, and optical system 180, as a function of the angular orientation of the stage mirror. Furthermore, the shear (i.e., transverse displacement) of the reference beam component of output beam 190 at detector 192 as a function of the orientation of stage mirror 154 is relatively small (e.g., less than about 50 microns) because the path length between beam steering element 110 and detector 192 on the return path can be made small.

More importantly, the differential shear between the reference beam component and the measurement beam component of output beam 190 can be made very small (e.g., smaller than about 1 micron). For example, in the embodiment of FIG. 1 the path length for the measurement beam component from PBS 132 to measurement mirror 154 is equal to that for the measurement beam component from measurement mirror 154 back to PBS 132. As a result, and because measurement beam 152 contacts measurement mirror 154 at normal incidence over a range of stage mirror orientations, there is no shear between the position of the measurement beam component at PBS 132 and the position of the return measurement beam component at PBS 132. In other words, input measurement beam component 122 and return measurement beam 172 contact the same point of PBS 132 over the range of orientations of the stage mirror. Subsequent propagation of return measurement beam 172 from mirror 126 to PBS 130 to detector 192 matches the shear imparted to return reference beam 174 by beam steering element 110.

Furthermore, system 100 does not invert the transverse profiles of the measurement and reference beam components of output beam 190 relative to one another at detector 192, thereby minimizing another source of errors.

We note that the purpose of optical system 180 is to provide a fold in the path of the return beam (particularly, the measurement component of the return beam). Because of the fold and the fact that the input measurement beam component and the return reference beam contact the same side of beam steering element 110, the beam steering element causes the reference and measurement beam components of output beam 190 to propagate parallel to one another. In the absence of the fold, the beam steering element would cause the reference and measurement beam components of the output beam to diverge by equal, but opposite, angles from a central optical axis as a function of the angular orientation of the measurement mirror 154. Furthermore, because each of the reference and measurement beam components of the output beam are derived from respective beams that contact beam steering element 110 the same number of times (i.e., once for the case of the embodiment of FIG. 1), changes in the orientation of the beam steering element do not (at least to low orders in the change in orientation) introduce path length differences betweens the measurement and reference components.

As described above, optical system 180 introduces the fold by adjusting the height of return beam 170 with respect to the x-axis. Thus, rhomb 140 provides the complementary height adjustment in the path of intermediate input beam 128. Moreover, the glass path length in rhomb 140 and right-angle prism 142 are selected to be equal to the glass path length in optical system 180 (hence the presence of glass flat 182). As a result of the equal glass paths, the optical path lengths for the measurement beam component to interferometer 150 and the return measurement beam component from interferometer 150 remain constant despite overall optical path length variations causes by changes in temperature (which would vary the refractive index in glass). Equal optical path lengths in glass for the reference and measurement components also occur with respect PBSs 130 and 132. Thus, interferometry system 100 is relatively insensitive to temperature fluctuations.

In other embodiments, different optical elements may replace rhomb 140, right-angle prism 142, and optical system 180. What is important, however, is that sufficient elements are introduced to cause the reference and measurement beam components of the output beam to propagate parallel to one another over a range of angular orientations (e.g., by introducing a fold in the path of the return beam). Furthermore, to minimize the shear of the measurement beam component, it is preferable that the optical path of the measurement beam component to the interferometer equals that of the return measurement beam component from the interferometer. Moreover, to provide temperature insensitivity of that minimized shear, it is preferable that the path of the measurement beam component to the interferometer in glass equals that of return measurement beam component from the interferometer. In addition, it is also preferable that the path of the measurement beam component and the return measurement beam component in glass equals that of the reference beam component and the return reference beam component (as is the case in system 100), to provide temperature insensitivity to the optical interference measurement.

In yet further embodiments, the interferometry system may be adapted to provide multiple measurement axes by separating the intermediate input beam into multiple beams, each of which provide an input beam to separate interferometers or different axes of a multi-axis interferometer.

As described above, an electronic control circuit adjusts the orientation of beam steering element 110 to cause measurement beam 152 in interferometer 150 (wherein measurement beam 152 is derived from input beam measurement component 122) to contact plane mirror 154 at normal incidence over a range of angular orientations of plane mirror 154. When this condition is met, and because return reference beam 174 also contacts beam steering element 110, the measurement and reference beam components of output beam 190 propagate parallel to one another and are substantially collinear. On the other hand, if measurement beam 152 is not caused to contact plane mirror 154 at normal incidence for any of a range of angular orientation of plane mirror 154, then there is a difference in propagation angle between the measurement and reference beam components of output beam 190.

Accordingly, to provide a servo control signal to beam steering element 110, a portion of output beam 190 is reflected by non-polarizing beam-splitter 191 as a second output beam 234. Output beam 234 is then incident on a differential angle displacement interferometer 250. The differential angle displacement interferometer introduces a relative phase shift $\phi_2$ between the measurement and reference beam components of output beam 234 that is related to the difference in the directions of propagation $\alpha_1$ of the measurement and reference beam components of the second output beam. The output from differential displacement interferometer 250 is a heterodyne electrical signal 253 that includes heterodyne phase ($\phi_1+\phi_2$) Details of the differential angle displacement interferometer are described in detail further below.

Analyzer 254 extracts phase ($\phi_1+\phi_2$) from heterodyne signal 253 and computes $\phi_2$ from the difference of measured phases ($\phi_1+\phi_2$) and $\phi_1$ (derived from heterodyne signal 248). Analyzer 254 next computes the difference in angle $\alpha_1$ from the computed phase $\phi_2$. Measured angle difference $\alpha_1$ is transmitted to servo controller 280 as signal 262 to generate servo control signal 282. Servo control signal 282 is transmitted to transducers 270A and 270B that control the orientation of beam steering element 110. Thus, the effect of the servo control of beam steering element 110 is to servo the orientation of element 110 to maintain $$\alpha_1=0 \qquad (2)$$

as the orientation of object mirror 154 changes and the direction of measurement beam 152 changes accordingly. When the condition $\alpha_1=0$ is met, the direction of propagation of measurement beam 152 is normal to the reflecting surface of object mirror 154. Moreover, the analyzer can calculate the change in the angular orientation of the measurement object based on the servo control signal sent to beam steering element 110 and its corresponding orientation of the beam steering element required to make measurement beam 152 normal to measurement object 154.

In further embodiments, the error signal in the electronic control circuit for beam steering element 110 may be derived from devices other than a differential angle displacement interferometer. For example, a quadrature detector or a CCD camera can be used to measure the difference in propagation direction of the measurement and reference beam components of the output beam and generate the error signal for the servo control loop. Furthermore, in additional embodiments, the electronic control system and dynamic beam steering element may include any of the corresponding features described in any of U.S. Pat. No. 6,271,923 issued Aug. 7, 2001 to Henry A. Hill; Published PCT Application WO 00/66969 corresponding to PCT/US00/12097 by Henry A. Hill; U.S. Pat. No. 6,313,918 B1 by Henry A. Hill et al.; and U.S. Utility patent application Ser. No. 10/226,591 by Henry A. Hill entitled "DYNAMIC INTERFEROMETER CONTROLLING DIRECTION OF INPUT BEAM," filed Aug. 23, 2002, all of which are incorporated herein by reference.

We now describe details of a differential angle displacement interferometer suitable for use as differential angle displacement interferometer 250.

Figure 3A:
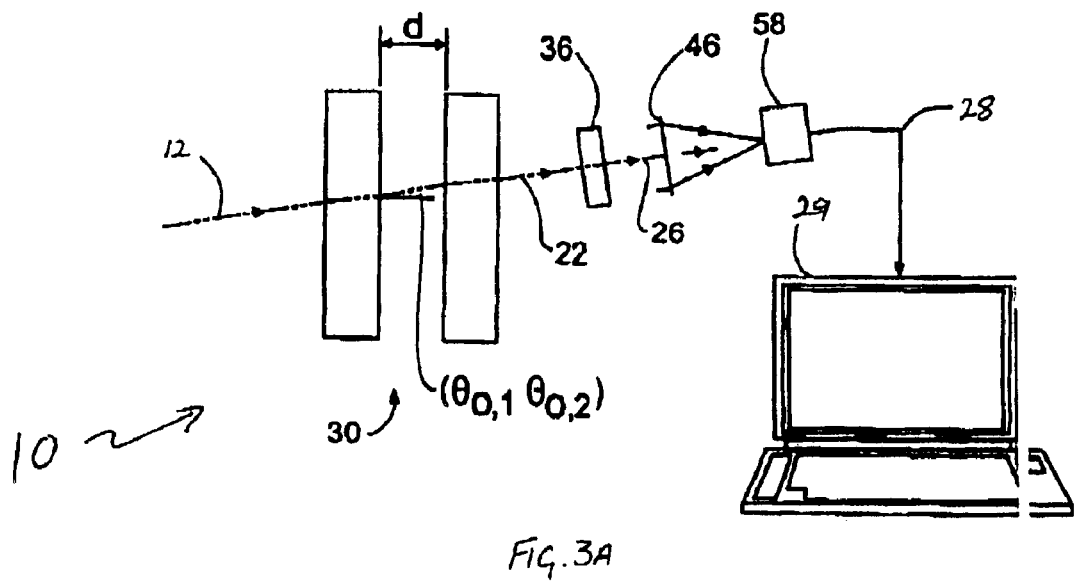
FIGS. 3a–3b are schematic diagrams of a differential angle displacement interferometer used in the system of FIG. 1.

A differential angle displacement interferometer 10 is shown schematically in FIG. 3a. Input beam 12 comprises two orthogonally polarized components having a difference in frequencies of $f_1$. Input beam 12 corresponds to, e.g., output beam 234 in FIG. 1. The planes of polarization of the two orthogonally polarized components are at angles of 45° to the plane of FIG. 3a. The directions of propagation of the two components of input beam 12 may be the same or different one from the other. Input beam 12 impinges on an etalon generally indicated by element number 30 with a gap d. The angles of incidence of the first and second components of input beam 12 at the interior faces of etalon 30 are $\theta_{o,1}$ and $\theta_{o,2}$, respectively. Angles $\theta_{o,1}$ and $\theta_{o,2}$ are selected so that the transmission of the first and second components of input beam 12 by etalon 30 are each substantially at a maximum excluding the maximum in transmission possible at $\theta_{o,j}=0$ for j=1,2. For the first embodiment, the difference angle $(\theta_{o,2}-\theta_{o,1})<<$ than the angular width of the corresponding transmission peak.

The first and second components of input 12 are transmitted as first and second orthogonally polarized beam components of output beam 22. Output beam 22 is transmitted by polarizer 36 to form mixed beam 26. Mixed beam 26 is focused by lens 46 to an image spot on detector 58. The beam forming the image spot is detected, preferably by photoelectric detection, by detector 58 as electrical interference signal 28 (corresponding to, e.g., heterodyne signal 253 in FIG. 1).

Signal 28 is a heterodyne signal having a heterodyne frequency equal to $f_1$, the difference in frequencies of the first and second components of input beam 12, and a heterodyne phase $\phi_{1,2}$. Heterodyne phase $\phi_{1,2}$ corresponds to, e.g., phase $\phi_2$ in the first embodiment and to phase $\phi_{20}$ in the second embodiment. Signal 28 is processed by, e.g., analyzer 254 (see FIG. 1) or other suitable electronic processor.

For a non-limiting example of a non-apodized square aperture at lens 46, the intensity profile $I_{h,1}$, at the image spot in the plane of FIG. 3a for components of beam 26 responsible for heterodyne signal 28, is written to a good approximation as $$I_{h,1} = \frac{C_{h,1}(1-R_1)^2}{[(1-R_1)^2 + 4R\sin^2(\delta'_{1,2}/2)] \times} \\ \sin c^2[kp_{1,2}(b/2)]\cos[\omega_1 t + (\phi_2 - \phi_1)] \quad (3)$$

where $$\delta'_j = 2knd(p_j \tan \theta_{o,j} + \cos \theta_{o,j}), j=1,2, \quad (4)$$

$$p_j = \sin \theta_{o,j} + \sin \theta_{i,j}, j=1,2, \quad (5)$$

$$\tan \phi_j = \frac{R_1 \sin \delta_j}{1 - R_1 \cos \delta_j}, \quad j=1,2 \quad (6)$$

Figure 3B:
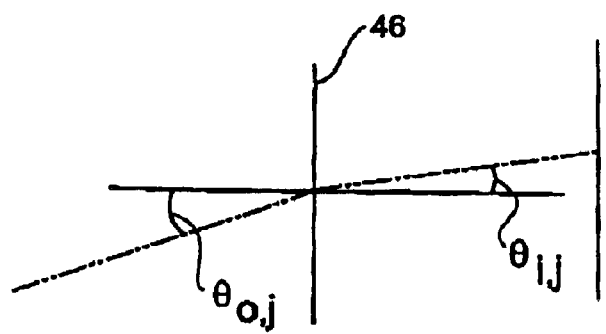

$\delta'_{1,2}=(\delta'_2+\delta'_1)/2$, $p_{1,2}=(p_2+p_1)/2$, b is the width of the square aperture at lens 46 in the plane of FIG. 3a, $C_{h,1}$ is a proportionality constant, $R_1$ is the intensity reflectivity of the interior surfaces of etalon 30, $\omega_1=2\pi f_1$, and k and n are, respectively, the wavenumber of the input beam components and the index of refraction of a medium in the gap of etalon 30. Angles $\theta_{o,1}$ and $\theta_{o,2}$ are defined according to FIG. 3b.

Heterodyne signal 28 is proportional to the integral of $I_{h,1}$ over the image spot. At a transmission peak, i.e. $\delta'_j \cong 2q_j\pi$ where $q_j$ is an integer typically>>1 and $\phi_j \cong 2q'_j\pi$ where $q'_j$ is an integer, sensitivity of heterodyne phase $\phi_{1,2}$ to changes in $\theta_{o,1}$ and $\theta_{o,2}$ may be expressed as $$d\varphi_{1,2} = -\frac{R_1}{(1-R_1)} 2knd \left[\sin\left(\frac{\theta_{o,2}+\theta_{o,1}}{2}\right)\right](d\theta_{o,2}-d\theta_{o,1}). \quad (7)$$

In order to reduce complexity in the display of general properties of the invention without departing from the scope or spirit of the invention, higher order terms in Eq. (7) have been omitted.

Heterodyne phase, $\phi_{1,2}=\phi_2-\phi_1$, may be obtained through the use of time based phase analysis procedures such as with a Hilbert transform or the like.

For an etalon spacing of d=4 mm, $R_1=0.99$, $\lambda=633$ nm, n=1.000, and $[(\theta_{o,2}+\theta_{o,1})/2]=0.0129$ rad, sensitivity of phase $\phi_{1,2}$ to changes in $\theta_{o,1}$ and $\theta_{o,2}$ is $$d\phi_{1,2}=-1.01\times10^5(d\theta_{o,2}-d\theta_{o,1}). \quad (8)$$

Or expressed in terms of sensitivity of inferred values for $(d\theta_{o,2}-d\theta_{o,1})$ from measured changes in phase $\phi_{1,2}$, $$(d\theta_{o,2}-d\theta_{o,1})=-0.99\times10^{-5}d\phi_{1,2}. \quad (9)$$

It is evident for the first embodiment that the measurement of a difference in angle $(d\theta_{o,2}-d\theta_{o,1})$ is based on an optical differencing technique wherein the measured phase difference between a first and second beam components is not sensitive in first order to effects of a frequency shift common to both the first and second beam components.

Improved accuracy in measurements of relative changes in directions of propagation of input beam components can be obtained by operating at a low frequency split between the first and second beam components. The option to use a low frequency split in certain end use applications is a direct consequence of the absence of first order input beam frequency shift effects in the phase of heterodyne signal 28 used to measure and monitor changes in relative directions of propagation of components of input beam 12.

The phase of the electrical interference signal used to measure and monitor changes in direction of propagation of the input beam may be determined using either a heterodyne technique as described or a homodyne technique when frequency $f_1 \cong 0$.

Differential angle displacement interferometer 10 can be used as a null detector without accurate knowledge of the coefficient of $d\phi_{1,2}$ in Equation (8). With the calibration of the coefficient of $d\phi_{1,2}$ in Equation (8), it can be used to measure relative changes in the direction of propagation of the first and second components of input beam 12 that are less than the width of the corresponding transmission peak.

The interferometry systems described above provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997).

Overlay depends directly on the performance, i.e. accuracy and precision, of the distance measuring interferometers used to position the wafer and reticle (or mask) stages. Since a lithography tool may produce $50–100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 4A:
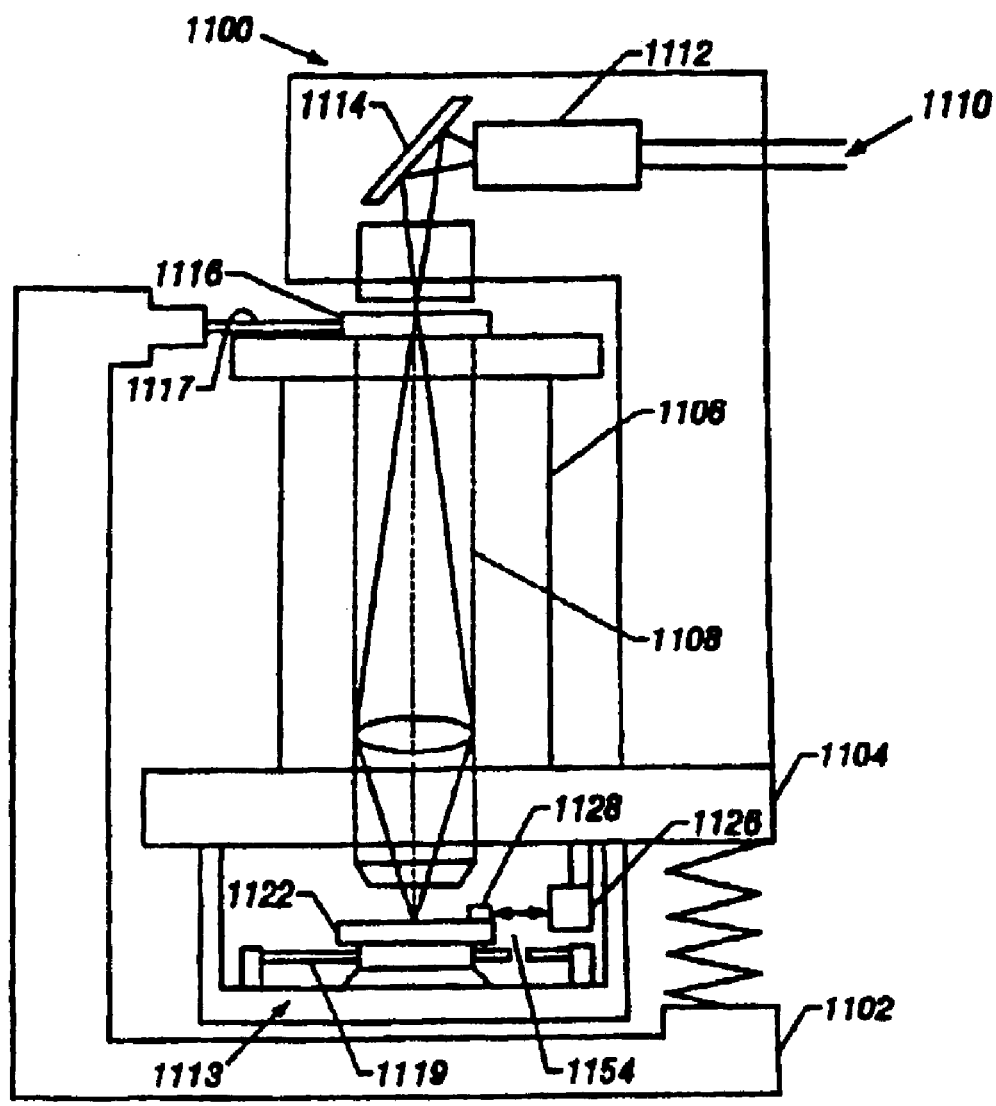
FIG. 4a is a schematic diagram of a lithography system used to make integrated circuits.

An example of a lithography scanner 1100 using an interferometry system 1126 is shown in FIG. 4a. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 4B:
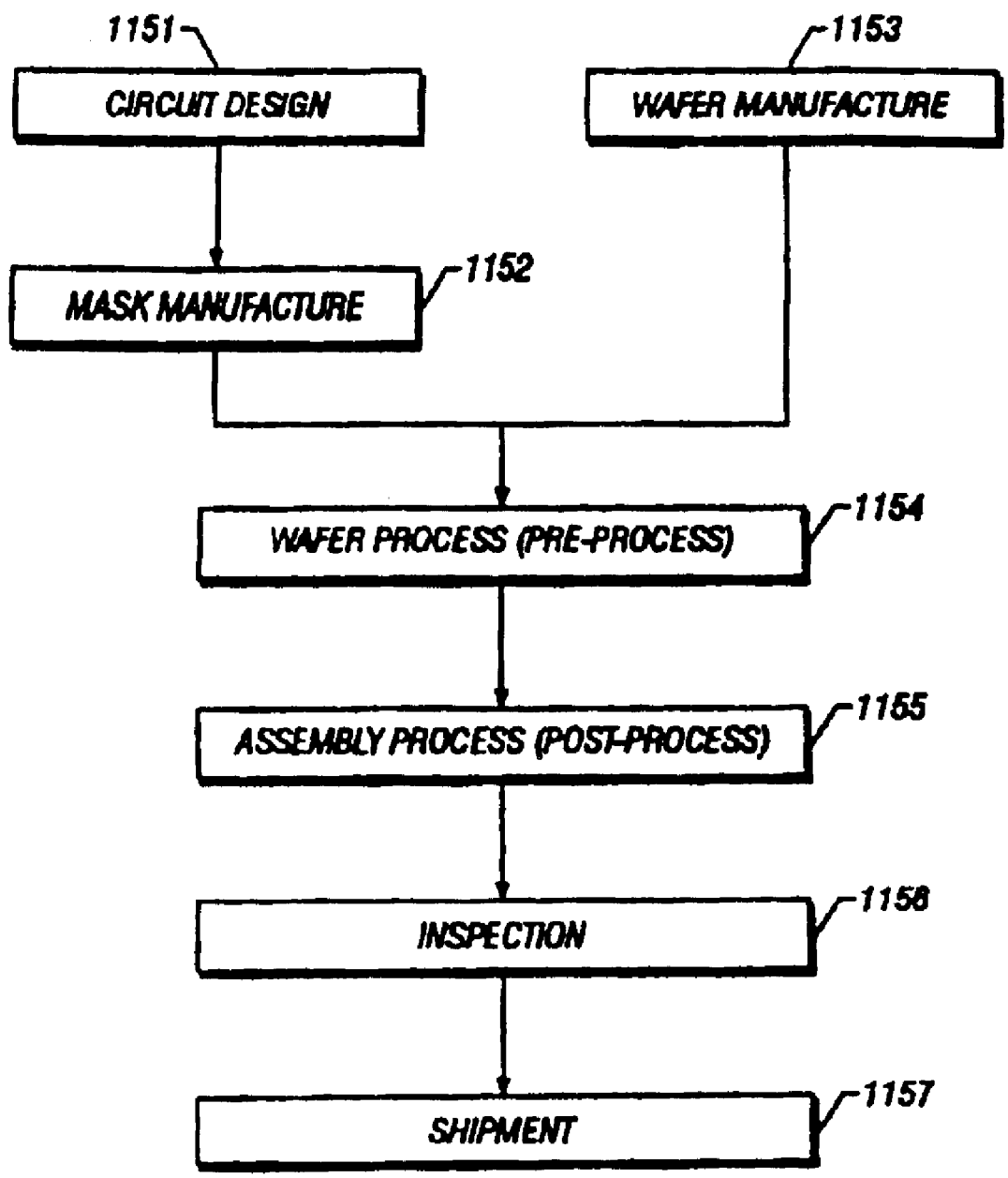
FIGS. 4b–4c are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 4b and 4c. FIG. 4b is a flow chart of the sequence of manufacturing a semiconductor device such as a semiconductor chip (e.g. IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 4C:
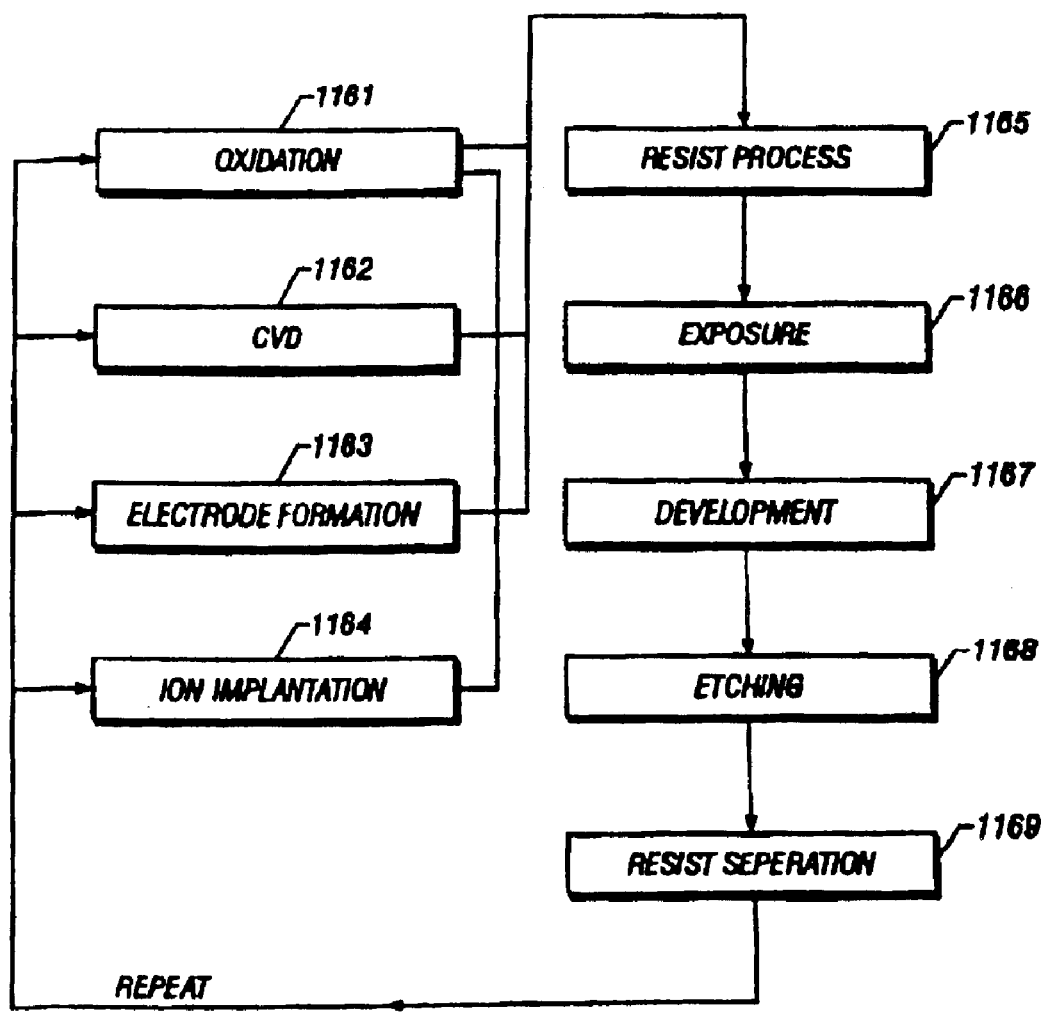

FIG. 4c is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 5:
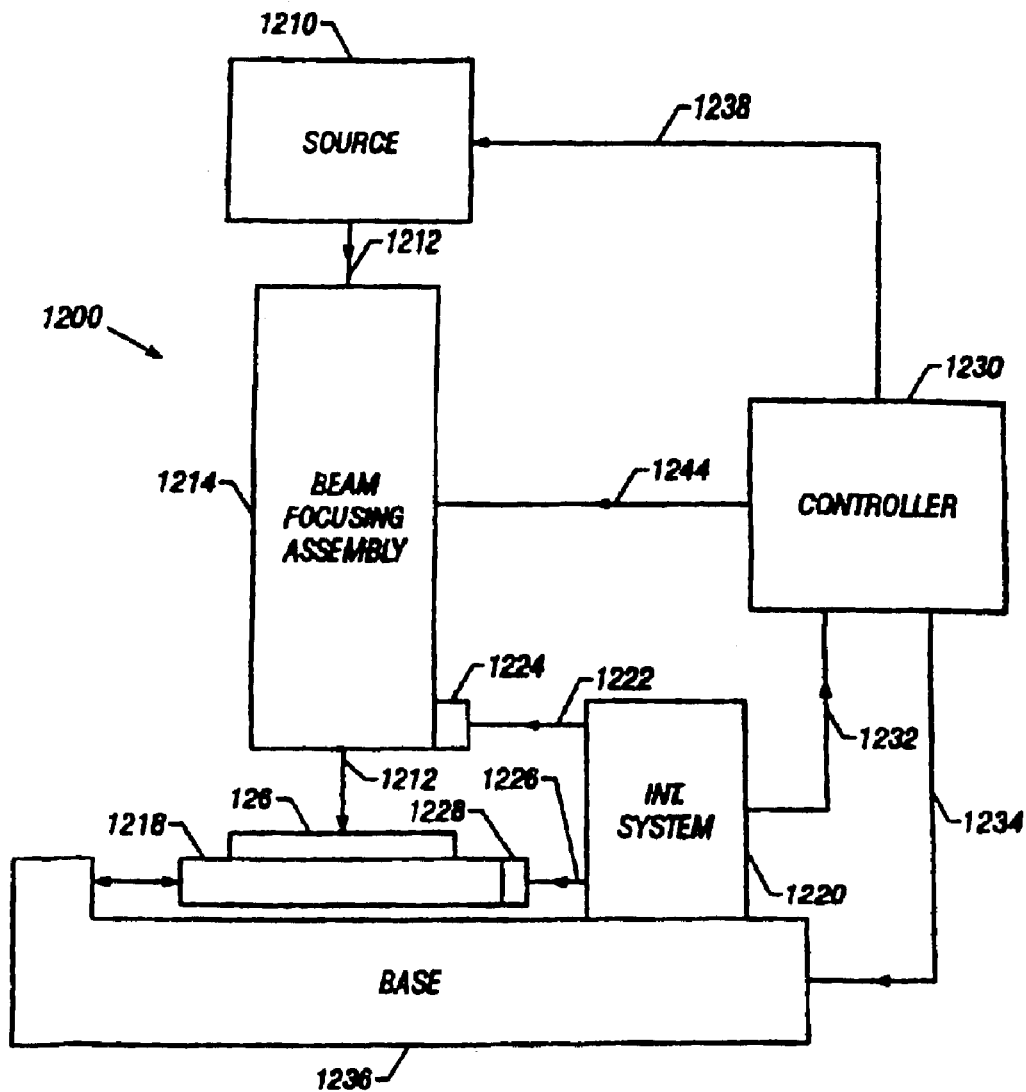
FIG. 5 is a schematic of a beam writing system.

As an example, a schematic of a beam writing system 1200 is shown in FIG. 5. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216.

Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. An interferometry system comprising:
    a first polarizing beam splitter positioned to separate an input beam into a first beam and a second beam;
    a beam steering element positioned to direct the first beam, and not the second beam, the first beam contacting the beam steering element;
    an interferometer positioned to receive one of the first and second beams and direct it to a measurement object, which reflects it to define a measurement return beam, and wherein the interferometer is further positioned to receive the other of the first and second beams and direct it to a reference object, which reflects it to define a reference return beam; and
    an electronic control circuit coupled to the beam steering element, wherein during operation the control circuit adjusts the orientation of the beam steering element in response to changes in the angular orientation of the measurement object,
    wherein the beam steering element is further positioned to direct the return beam derived from the second beam, and not the return beam derived from the first beam, the return beam derived from the second beam contacting the beam steering element, and
    wherein the first polarizing beam splitter is positioned to recombine the return beams to form an output beam.

2. The interferometry system of claim 1, wherein the interferometer directs the first beam to contact the measurement object, the first beam defining a measurement beam, and the interferometer directs the second beam to contact the reference object, the second beam defining a reference beam.

3. The system of claim 1, further comprising a detector system for measuring interferometric information in the output beam.

4. The system of claim 3, wherein the detector system comprises a fiber optic pick-up (FOP) and a photodetector, wherein the FOP is positioned to couple the output beam to the photodetector.

5. The system of claim 2, further comprising a second polarizing beam splitter positioned to recombine the measurement and reference beams after the measurement beam contacts the beam steering element and before the interferometer redirects the measurement and reference beams, and separate return measurement and reference beams after the interferometer and before the return reference beam contacts the beam steering element.

6. The system of claim 5, wherein measurement and reference beams travel along a first path from the second polarizing beam splitter to the interferometer, the return measurement and reference beams travel along a second path from the interferometer to the second polarizing beam splitter, and the first and second paths differ.

7. The system of claim 6, wherein the measurement beam and the return reference beam contact the same side of the beam steering element.

8. The system of claim 7, wherein the second path includes an optical system that provides a fold.

9. The system of claim 8, wherein the fold causes the measurement and reference beam components of the output beam to propagate parallel to one another over a range of angular orientations of the measurement object.

10. The system of claim 8, wherein the optical path length of the first path equals that of the second path.

11. The system of claim 8, wherein the optical path length of the first path relative to that of the second path is selected to minimize the differential shear between the reference and measurement beam components of the output beam.

12. The system of claim 2, wherein during operation the control circuit causes the beam steering element to direct the measurement beam to contact the measurement object at normal incidence over a range of angular orientations of the measurement object.

13. The system of claim 2, wherein during operation the control circuit adjusts the orientation of the beam steering element based on an error signal corresponding to a difference in propagation direction between components in the output beam corresponding to the measurement and reference return beams.

14. The system of claim 13, wherein during operation the control circuit adjusts the orientation of the beam steering element to minimize the error signal.

15. The system of claim 13, wherein the electronic control circuit comprises a differential angle displacement interferometer configured to generate the error signal.

16. The system of claim 1, further comprising a source for producing the input beam, wherein the input beam comprises a heterodyne frequency splitting between orthogonal polarization components corresponding the first and second beams.

17. The system of claim 2, wherein the measurement object comprises a plane mirror.

18. The system of claim 2, wherein the interferometer is a single-pass interferometer that directs the measurement beam to contact the measurement object only once.

19. The system of claim 2, wherein the interferometer comprises a polarizing beam-splitter positioned to direct the measurement beam to the measurement object and the reference beam to the reference object.

20. The system of claim 19, wherein the interferometer further comprises a reference quarter wave retarder positioned between the polarizing beam splitter in the interferometer and the reference object, and a measurement quarter wave retarder positioned between the polarizing beam splitter in the interferometer and the measurement object.

21. A lithography system for use in fabricating integrated circuits on a wafer, the system comprising:
    a stage for supporting the wafer;
    an illumination system for imaging spatially patterned radiation onto the wafer;
    a positioning system for adjusting the position of the stage relative to the imaged radiation; and
    the system of claim 1 for monitoring the position of the wafer relative to the imaged radiation.

22. A method for fabricating integrated circuits, the method comprising using the lithography system of claim 21.

23. A lithography system for use in fabricating integrated circuits on a wafer, the system comprising:
    a stage for supporting the wafer; and
    an illumination system including a radiation source, a mask, a positioning system, a lens assembly, and the system of claim 1,
    wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

24. A method for fabricating integrated circuits, the method comprising using the lithography system of claim 23.

25. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and the system of claim 1 for monitoring the position of the stage relative to the beam directing assembly.

26. An interferometry method comprising:

separating an input beam into a first beam and a second beam, wherein the first and second beams are orthogonally polarized;

using a beam steering element to direct the first beam, and not the second beam, the first beam contacting the beam steering element;

directing one of the first and second beams to a measurement object, which reflects it to define a measurement return beam;

directing the other of the first and second beams to a reference object, which reflects it to define a reference return beam;

using the beam steering element to direct the return beam derived from the second beam, and not the return beam derived from the first beam, the return beam derived from the second beam contacting the beam steering element;

combining the return beams to form an output beam; and using an electronic control circuit to adjust the orientation of the beam steering element in response to changes in the angular orientation of the measurement object.

27. A lithography method for use in fabricating integrated circuits on a wafer, the method comprising:

supporting the wafer on a moveable stage;

imaging spatially patterned radiation onto the wafer;

adjusting the position of the stage; and monitoring the position of the stage using the method of claim 26.

28. A method for fabricating integrated circuits, the method comprising the lithography method of claim 27.

29. A lithography method for use in the fabrication of integrated circuits comprising:

directing input radiation through a mask to produce spatially patterned radiation;

positioning the mask relative to the input radiation;

monitoring the position of the mask relative to the input radiation using the method of claim 26; and imaging the spatially patterned radiation onto a wafer.

30. A method for fabricating integrated circuits, the method comprising the lithography method of claim 29.

31. A lithography method for fabricating integrated circuits on a wafer comprising:

positioning a first component of a lithography system relative to a second component of a lithography system to expose the wafer to spatially patterned radiation; and monitoring the position of the first component relative to the second component using the method of claim 26.

32. A method for fabricating integrated circuits, the method comprising the lithography method of claim 31.

33. A method for fabricating a lithography mask, the method comprising:

directing a write beam to a substrate to pattern the substrate;

positioning the substrate relative to the write beam; and monitoring the position of the substrate relative to the write beam using the interferometry method of claim 26.

* * * * *